(12) United States Patent
Jeon et al.

(10) Patent No.: US 9,786,732 B2
(45) Date of Patent: Oct. 10, 2017

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Joohee Jeon, Yongin (KR); Chaungi Choi, Yongin (KR); Hyeonsik Kim, Yongin (KR); Hyehyang Park, Yongin (KR); Huiwon Yang, Yongin (KR); Eunyoung Lee, Yongin (KR); Seungho Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/094,673

(22) Filed: Apr. 8, 2016

(65) Prior Publication Data
US 2017/0117349 A1 Apr. 27, 2017

(30) Foreign Application Priority Data
Oct. 22, 2015 (KR) .................. 10-2015-0147547

(51) Int. Cl.
*H01L 51/52* (2006.01)
*H01L 27/32* (2006.01)
*H01L 51/56* (2006.01)

(52) U.S. Cl.
CPC ...... *H01L 27/3279* (2013.01); *H01L 51/5228* (2013.01); *H01L 51/5234* (2013.01); *H01L 51/56* (2013.01); *H01L 2227/323* (2013.01)

(58) Field of Classification Search
CPC . H01L 51/56; H01L 51/5228; H01L 51/5234; H01L 27/3279
See application file for complete search history.

(56) References Cited

U.S. PATENT DOCUMENTS 7,038,362 B2     5/2006   Miura
8,692,817 B2 *   4/2014   Hong .................. H01L 27/3211
                                                          345/206

(Continued)

FOREIGN PATENT DOCUMENTS

KR    2003-0008380 A    1/2003
KR    10-2010-0042799 A 4/2010

(Continued)

*Primary Examiner* — Nicholas Tobergte
(74) *Attorney, Agent, or Firm* — H.C. Park & Associates, PLC

(57) ABSTRACT

An organic light-emitting display apparatus includes a substrate including a first region configured to realize an image, and a second region through which an external light penetrates; a first electrode provided in the first region; an auxiliary electrode provided in the second region; a pixel defining layer provided in at least the first region and including a first opening exposing at least a part of the first electrode and a second opening exposing at least a part of the auxiliary electrode; a second electrode provided throughout the first region and the second region, facing the first electrode, and electrically connected to the auxiliary electrode; and an intermediate layer provided in at least the first region, provided above the first electrode and below the second electrode, and including an organic emission layer.

20 Claims, 16 Drawing Sheets

(56) References Cited

U.S. PATENT DOCUMENTS

| | | | |
|---|---|---|---|
| 8,803,167 B2* | 8/2014 | Koh | H01L 27/3244 |
| | | | 257/40 |
| 9,099,413 B2* | 8/2015 | Kim | H01L 22/12 |
| 9,117,776 B2* | 8/2015 | Kim | H01L 27/322 |
| 9,136,501 B2* | 9/2015 | Park | H01L 51/5234 |
| 9,159,295 B2* | 10/2015 | Jung | G09G 5/02 |
| 9,385,331 B2* | 7/2016 | Jang | H01L 51/0097 |
| 2003/0016309 A1 | 1/2003 | Ha | |
| 2009/0137074 A1* | 5/2009 | Lee | H01L 27/3267 |
| | | | 438/29 |
| 2010/0097295 A1 | 4/2010 | Kwak | |
| 2015/0014661 A1 | 1/2015 | Joo et al. | |
| 2016/0300902 A1* | 10/2016 | You | H01L 27/3276 |

FOREIGN PATENT DOCUMENTS

| | | |
|---|---|---|
| KR | 10-2013-0066965 A | 6/2013 |
| KR | 10-2015-0006605 A | 1/2015 |
| KR | 10-2015-0033141 A | 4/2015 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims the priority of and all the benefits accruing under 35 U.S.C. §119 of Korean Patent Application No. 10-2015-0147547, filed on Oct. 22, 2015, in the Korean Intellectual Property Office (KIPO), the disclosure of which is incorporated herein in its entirety by reference.

BACKGROUND OF THE INVENTION

1. Field of the Disclosure

One or more embodiments relate to an organic light-emitting display apparatus and a method of manufacturing the same, and more particularly, to a see-through organic light-emitting display apparatus capable of recognizing not only an image realized by the see-through organic light-emitting display apparatus but also an external background.

2. Description of the Related Art

An organic light-emitting display apparatus includes an organic light-emitting device including a hole injection electrode, an electron injection electrode, and an organic emission layer disposed between the hole injection electrode and the electron injection electrode. The organic light-emitting display apparatus is a self-emitting type display apparatus that generates light when excitons, which are generated as holes injected from the hole injection electrode and electrons injected from the electron injection electrode combine in the organic emission layer, change from an excited state to a ground state.

Since the organic light-emitting display apparatus that is a self-emitting type display apparatus does not need a separate light source, the organic light-emitting display apparatus may be driven at a low voltage, may be lightweight and thin, and has an excellent viewing angle, an excellent contrast, and an excellent response speed. Thus, an application range of the organic light-emitting display apparatus is expanding from a personal portable device, such as an MP3 player or a mobile phone, to a television (TV).

With regard to such an organic light-emitting display apparatus, a see-through organic light-emitting display apparatus enabling a user to recognize not only an image realized by the see-through organic light-emitting display apparatus but also an external background is being researched.

SUMMARY OF THE INVENTION

An organic light-emitting device includes a first electrode, a second electrode, and an organic emission layer disposed between the first and second electrodes.

In order to realize a top-emitting organic light-emitting display apparatus in which a light generated from an organic emission layer is transmitted towards a second electrode and externally discharged, the second electrode may be formed of a conductive material having a thin-film shape. However, when a thickness of the second electrode decreases, resistance increases, and thus currents flowing through pixels located at different locations may vary due to a voltage drop phenomenon, and accordingly, display quality of the organic light-emitting display apparatus may deteriorate.

One or more embodiments include an organic light-emitting display apparatus having improved display quality by reducing a voltage drop phenomenon while forming a second electrode in a thin-film.

Additional aspects will be set forth in part in the description which follows and, in part, will be apparent from the description, or may be learned by practice of the presented embodiments.

According to one or more embodiments, an organic light-emitting display apparatus includes a substrate including a first region configured to realize an image, and a second region through which an external light penetrates; a first electrode provided in the first region; an auxiliary electrode provided in the second region; a pixel defining layer provided in at least the first region and including a first opening exposing at least a part of the first electrode and a second opening exposing at least a part of the auxiliary electrode; a second electrode provided throughout the first region and the second region, facing the first electrode, and electrically connected to the auxiliary electrode; and an intermediate layer provided in at least the first region, provided above the first electrode and below the second electrode, and including an organic emission layer.

The auxiliary electrode may overlap the second opening along a first direction that is perpendicular to a top surface of the substrate.

The second electrode may extend to inside of the second opening included in the second region and directly contact the auxiliary electrode.

The auxiliary electrode may be arranged in the second opening.

The auxiliary electrode may include a transparent conductive oxide.

The organic light-emitting display apparatus may further include a pixel circuit unit provided in the first region and electrically connected to the first electrode, wherein the pixel circuit unit may include a transistor including an active layer and a gate electrode insulated from the active layer; and a capacitor including a lower electrode provided on a same layer as the gate electrode, and an upper electrode facing the lower electrode.

The upper electrode may be provided on a same layer as the auxiliary electrode and include a first upper electrode formed of a same material as the auxiliary electrode and a second upper electrode provided on the first upper electrode.

The active layer may include a source region, a channel region, and a drain region, wherein the source region may be electrically connected to the upper electrode.

The organic light-emitting display apparatus may further include a source electrode and a drain electrode, which are arranged above the gate electrode and respectively electrically connected to the source region and the drain region; and an interlayer insulating film provided above the gate electrode and below the source and drain electrodes, and including a third opening corresponding to the second region, wherein the third opening may overlap the second opening along a first direction that is perpendicular to a top surface of the substrate.

At least a part of the pixel circuit unit may overlap the first electrode along a first direction that is perpendicular to a top surface of the substrate.

The organic light-emitting display apparatus may further include a via insulating film provided on the interlayer insulating film to cover the source and drain electrodes, and including a fourth opening corresponding to the second region, wherein the fourth opening may overlap the second opening along a first direction that is perpendicular to a top surface of the substrate.

The intermediate layer may further include a common layer provided on the first electrode and below the organic emission layer, wherein the common layer may include a fifth opening corresponding to the second region, and overlap the second opening along a first direction that is perpendicular to a top surface of the substrate.

At least a part of a top surface of the auxiliary electrode may be exposed by the fifth opening, and the second electrode may directly contact the top surface of the auxiliary electrode, which is exposed by the fifth opening.

According to one or more embodiments, a method of manufacturing an organic light-emitting display apparatus, the method includes preparing a substrate including a first region configured to realize an image and a second region through which an external light penetrates; forming an auxiliary electrode in the second region; forming a first electrode in the first region; forming, in at least the first region, a pixel defining layer including a first opening exposing at least a part of the first electrode and a second opening exposing at least a part of the auxiliary electrode; forming an organic emission layer in the first region; and forming, throughout the first region and the second region, a second electrode directly contacting the auxiliary electrode exposed by the second opening.

The method may further include, before the forming of the first electrode, forming, in the first region, a pixel circuit unit electrically connected to the first electrode and including a transistor and a capacitor, wherein the forming of the pixel circuit unit may include forming an active layer of the transistor above the substrate; forming, above the active layer, a gate electrode insulated from the active layer and a lower electrode of the capacitor; forming an insulating film to cover the gate electrode and the lower electrode; forming, on the insulating film, a first conductive material and a second conductive material; and forming an auxiliary electrode in the second region and an upper electrode of the capacitor facing the lower electrode in the first region by respectively patterning the first conductive material and the second conductive material by using a mask.

The first conductive material may include a transparent conductive oxide.

The forming of the auxiliary electrode and the upper electrode may include forming, on the insulating film, the first conductive material, the second conductive material, and a photoresist; irradiating, on the photoresist, a light by using a halftone mask including a transmission portion through which a light penetrates, a semi-transmission portion through which a light partially penetrates, and a shielding portion blocking a light; forming a first photoresist corresponding to the lower electrode and a second photoresist corresponding to at least a part of the second region and having a thickness thinner than the first photoresist by removing a region of the photoresist, on which the light is irradiated; etching the second conductive material corresponding to a region from which the photoresist is completely removed and the first conductive material formed below the second conductive material; forming a third photoresist by completely removing the second photoresist and removing a part of the first photoresist via ashing; forming the auxiliary electrode by removing the second conductive material corresponding to a region from which the second photoresist is removed; and removing the third photoresist.

The method may further include forming a first insulating material covering the auxiliary electrode and the upper electrode; forming an interlayer insulating film including a third opening exposing at least a part of the auxiliary electrode and a contact hole exposing at least a part of each of a source region and a drain region included in the active layer by patterning the first insulating material; and forming a source electrode and a drain electrode, which are respectively electrically connected to the source region and the drain region through the contact hole.

The method may further include, before the forming of the organic emission layer, forming an organic material covering the auxiliary electrode and the first electrode; and forming a common layer including a fourth opening exposing at least a part of the auxiliary electrode by removing the organic material provided on at least a part of the auxiliary electrode.

The organic material may be removed via laser drilling.

According to one or more embodiments, an organic light-emitting display apparatus comprising a substrate comprising a first region on which the apparatus configured to realize an image, and a second region through which an external light penetrates through the apparatus; a first electrode provided in the first region; an auxiliary electrode provided in the second region; a pixel defining layer provided in at least the first region and comprising a first opening exposing at least a part of the first electrode and a second opening exposing at least a part of the auxiliary electrode; a second electrode provided throughout the first region and the second region, facing the first electrode, and electrically connected to the auxiliary electrode; and an intermediate layer provided in at least the first region, provided above the first electrode and below the second electrode, and comprising an organic emission layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components wherein.

DETAILED DESCRIPTION

Figure 1:
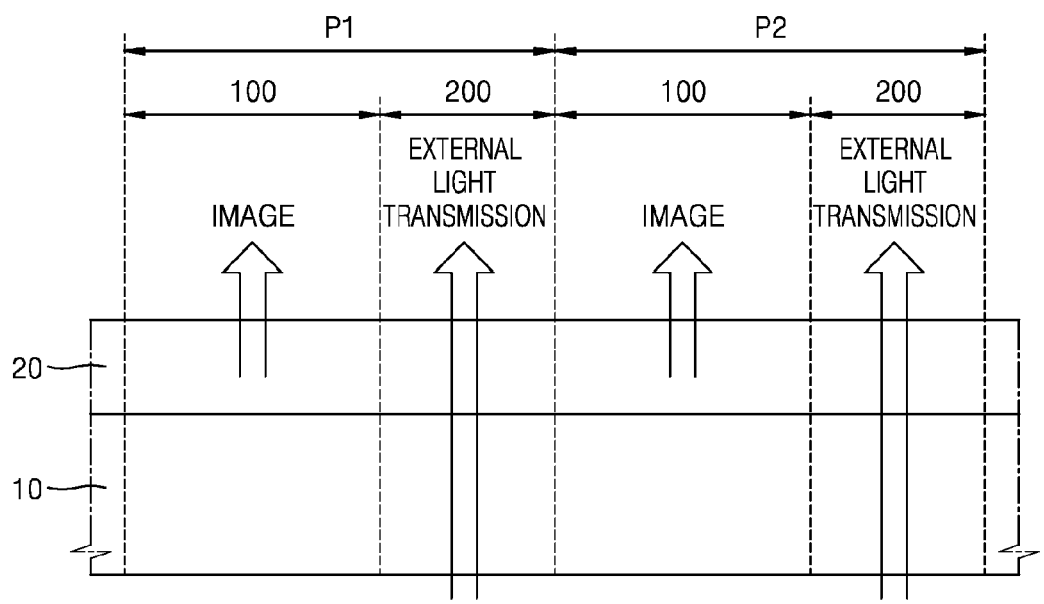
FIG. 1 is a cross-sectional view schematically illustrating an organic light-emitting display apparatus according to an embodiment.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

While such terms as "first", "second", etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including" or "having," etc., are intended to indicate the existence of the features or components, and are not intended to preclude the possibility that one or more other features or components may exist or may be added.

As used herein, the term "and/or" includes any and all combinations of one or more of the associated listed items. Expressions such as "at least one of" when preceding a list of elements, modify the entire list of elements and do not modify the individual elements of the list.

In drawings, for convenience of description, sizes of components may be exaggerated for clarity. For example, since sizes and thicknesses of components in drawings are arbitrarily shown for convenience of description, the sizes and thicknesses are not limited thereto.

Hereinafter, one or more embodiments of the disclosure will be described in detail with reference to accompanying drawings.

FIG. 1 is a cross-sectional view schematically illustrating an organic light-emitting display apparatus according to an embodiment.

Referring to FIG. 1, the organic light-emitting display apparatus according to an embodiment includes a substrate 10 and a displayer 20 disposed above the substrate 10 and including a plurality of pixels each including a first region 100 from which a light is emitted from a light emitting device in the displayer 20 and a second region 200 through which an external light penetrates. The external light is a light incident on the organic light-emitting display apparatus from a source outside the organic light-emitting display apparatus, and the external light incident on one surface of the organic light-emitting display apparatus may be recognized by a user after penetrating through the substrate 10 and the displayer 20 and passing through another surface of the organic light-emitting display apparatus, which faces the one surface.

In other words, the user located at a side where an image is realized by observe the image outside the substrate 10. In FIG. 1, the organic light-emitting display apparatus is a top-emission type in which an image of the displayer 20 is realized in a direction opposite to the substrate 10, but an embodiment is not limited thereto. In other words, the organic light-emitting display apparatus according to another embodiment may be a bottom-emission type in which an image of the displayer 20 is realized in a direction of the substrate 10 or a dual-emission type in which an image of the displayer 20 is realized both in a direction of the substrate 10 and in a direction opposite to the substrate 10.

In FIG. 1, a first pixel P1 and a second pixel P2 are illustrated as two adjacent pixels from among the plurality of pixels of the organic light-emitting display apparatus, according to an embodiment. Each of the first and second pixels P1 and P2 includes the first region 100 and the second region 200, wherein an image is realized from the first region 100 of the displayer 20 and an external light penetrates through the second region 200. Although not illustrated, the second region 200 may be connected to the plurality of pixels.

Devices that include an opaque material such as metal, such as a transistor, a capacitor, and an organic light-emitting device, are not disposed in the second region 200, and accordingly, external light transmittance of the second region 200 may be increased.

Figure 2:
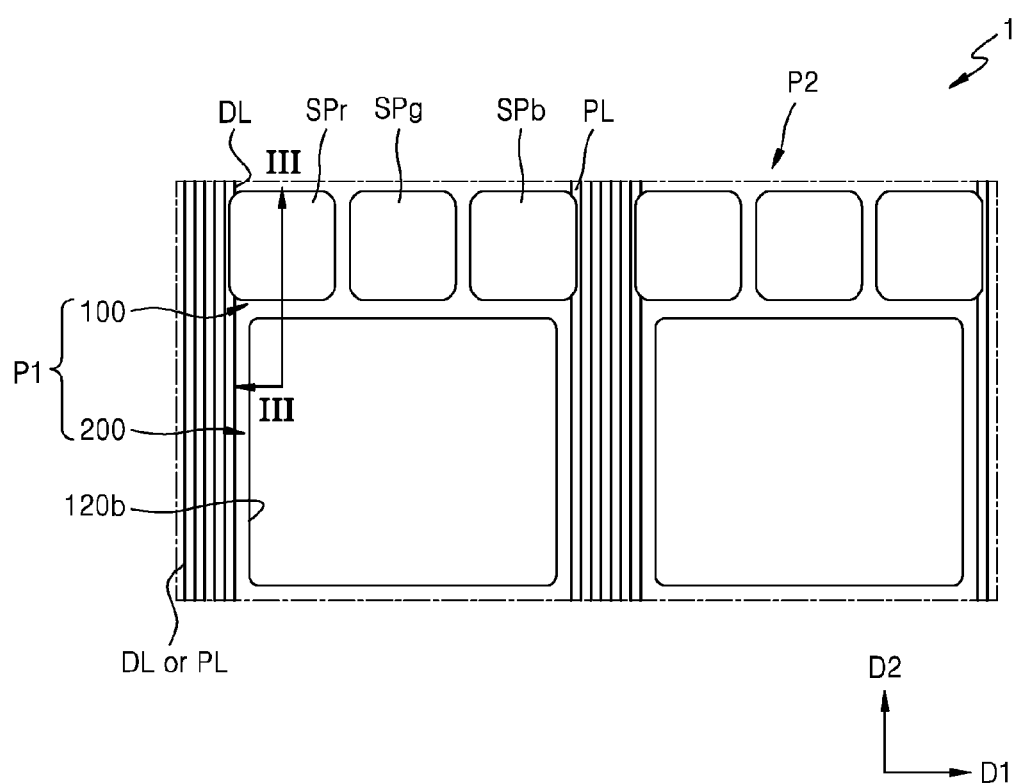
FIG. 2 is a plan view schematically illustrating a plurality of pixels included in an organic light-emitting display apparatus according to an embodiment.
Figure 3:
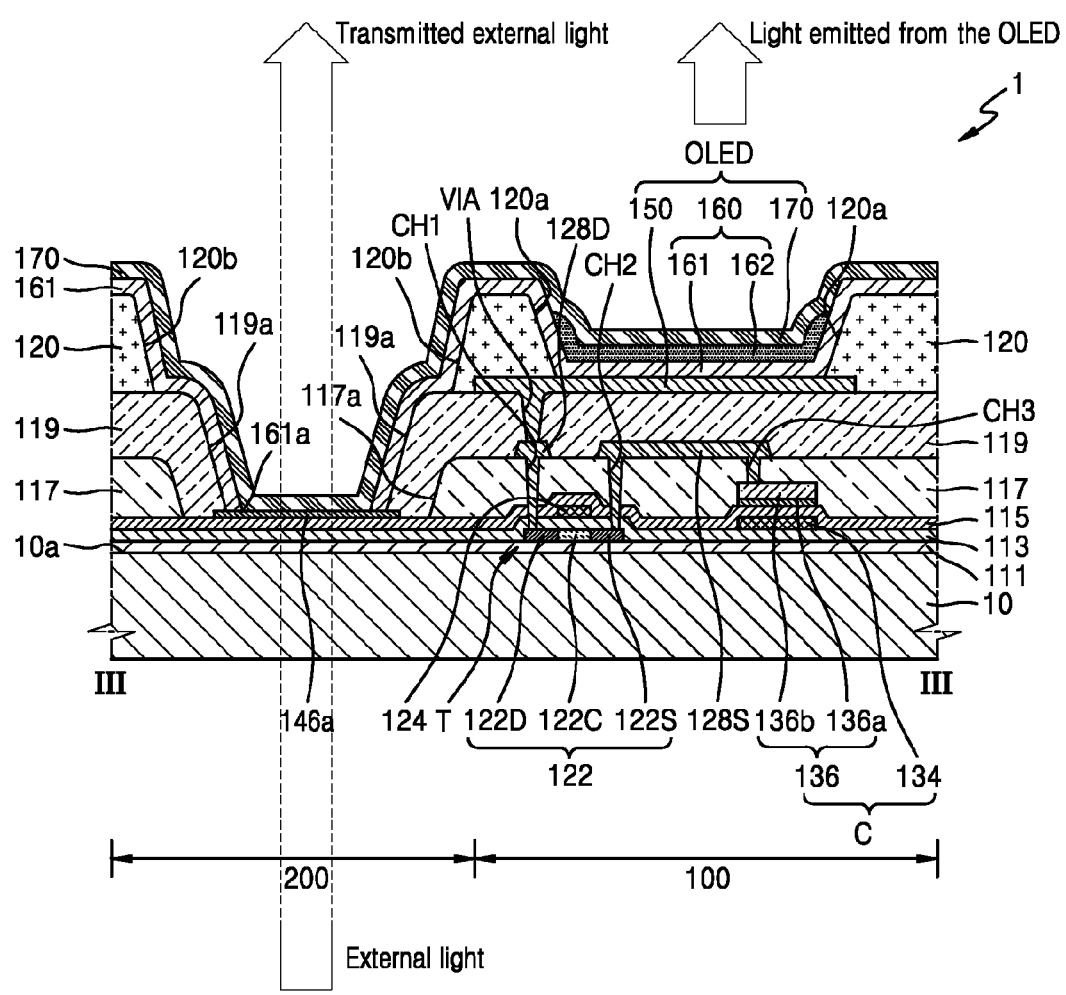
FIG. 3 is a cross-sectional view taken along a line III-III of FIG. 2.

FIG. 2 is a plan view schematically illustrating a plurality of pixels included in an organic light-emitting display apparatus 1, according to an embodiment, and FIG. 3 is a cross-sectional view taken along a line III-III of FIG. 2.

Referring to FIGS. 2 and 3, the organic light-emitting display apparatus 1 according to an embodiment includes the substrate 10 including the first region 100 realizing an image and the second region 200 through which an external light penetrates, a first electrode 150 disposed in the first region 100, an auxiliary electrode 146a disposed in the second region 200, a pixel defining layer 120 disposed in at least the first region 100 and including a first opening 120a exposing at least a part of the first electrode 150 and a second opening 120b exposing at least a part of the auxiliary electrode 146a, a second electrode 170 disposed throughout the first region 100 and the second region 200, facing the first electrode 150, and electrically connected to the auxiliary electrode 146a, and an intermediate layer 160 disposed in at least the first region 100, disposed above the first electrode 150 and below the second electrode 170, and including an organic emission layer 162.

Each of the first and second pixels P1 and P2 included in the organic light-emitting display apparatus 1 includes the first region 100 emitting a certain colored light and the second region 200 through which an external light penetrates, and a user may view an image outside the organic light-emitting display apparatus 1 through the second region 200.

A first sub-pixel SPr, a second sub-pixel SPg, and a third sub-pixel SPb, which emit different colored lights, may be disposed in the first region 100, and may respectively emit a red light, a green light, and a blue light. However, an embodiment is not limited thereto, and a combination of any colored light is possible as long as a white light is emitted.

The first sub-pixel SPr, the second sub-pixel SPg, and the third sub-pixel SPb may each be driven by a pixel circuit unit in any form. According to an embodiment, at least a part of the pixel circuit unit may overlap the first electrode 150 included in each of the first sub-pixel SPr, the second sub-pixel SPg, and the third sub-pixel SPb, along a direction perpendicular to a top surface 10a of the substrate 10.

The organic light-emitting display apparatus 1 according to an embodiment may include the first and second pixels P1 and P2 disposed along a first direction D1, and at least one wire extending along a second direction D2 crossing the first direction D1 may be disposed between the first and second pixels P1 and P2. According to an embodiment, the wire extending along the second direction D2 may be a data line DL and/or a power supply line PL, but the wire is not limited thereto. In other words, according to an embodiment, the wire may be a scan line (not shown).

According to an embodiment, the first and second pixels P1 and P2 each include the second region 200 through which an external light penetrates, and the second region 200 may be defined by the data line DL and/or the power supply line PL disposed between the first and second pixels P1 and P2.

The auxiliary electrode 146a electrically connected to the second electrode 170 may be disposed in the second region 200 of the organic light-emitting display apparatus 1 according to an embodiment. The auxiliary electrode 146a may be disposed in the second opening 120b included in the pixel defining layer 120. In other words, the auxiliary electrode 146a may overlap the second opening 120b along a direction perpendicular to the top surface 10a of the substrate 10, and may directly contact the second electrode 170 that extends from the first region 100 into the second opening 120b of the second region 200.

The auxiliary electrode 146a may be formed of a transparent conductive oxide. For example, the auxiliary electrode 146a may include at least one material from among indium tin oxide (ITO), zinc tin oxide (ZTO), zinc oxide (ZnO), gallium doped zinc oxide (GZO), and indium gallium oxide (IGO). Accordingly, even when the auxiliary electrode 146a is disposed in the second region 200, an external light incident on the organic light-emitting display apparatus 1 may penetrate through the second region 200.

According to an embodiment, the auxiliary electrode 146a may be formed in the second region 200 that occupies a large area in a display region of the organic light-emitting display apparatus 1 such that the auxiliary electrode 146a directly contacts the second electrode 170, thereby providing the organic light-emitting display apparatus 1 in which resistance of the second electrode 170 is reduced. In other words, according to the above-described structure, display quality of the organic light-emitting display apparatus 1 may increase while not reducing an aperture ratio.

Referring to FIG. 3, the first sub-pixel SPr is disposed in the first region 100, includes a transistor T and a capacitor C, and may further include the pixel circuit unit electrically connected to the first electrode 150.

A buffer layer 111 may be disposed on the substrate 10, the transistor T and the capacitor C may be disposed in the first region 100 above the buffer layer 111, and the auxiliary electrode 146a may be disposed in the second region 200 above the buffer layer 111.

The transistor T may include an active layer 122 disposed on the buffer layer 111 and a gate electrode 124 insulated from the active layer 122. The active layer 122 may include a channel region 122C, and a source region 122S and a drain region 122D that are spaced apart from each other, wherein the channel region 122C is disposed therebetween.

A lower gate insulating film 113 may be disposed on the active layer 122 and below the gate electrode 124. The lower gate insulating film 113 may extend from the first region 100 to the second region 200.

The lower electrode 134 of the capacitor C may be disposed on the same layer as the gate electrode 124 and formed of the same material as the gate electrode 124.

An upper gate insulating film 115 covering the gate electrode 124 may be disposed on the lower gate insulating film 113. The upper gate insulating film 115 may be a single film or a double film formed of an inorganic material, such as silicon nitride (SiNx) and/or silicon oxide (SiO2).

The upper electrode 136 of the capacitor C may be disposed on the upper gate insulating film 115. The upper electrode 136 may face the lower electrode 134 and may be disposed on the same layer as the auxiliary electrode 146a. According to an embodiment, the upper gate insulating film 115 may be a dielectric film disposed on the lower electrode 134 of the capacitor C and below the upper electrode 136 of the capacitor C. The upper electrode 136 of the capacitor C may include a first upper electrode 136a and a second upper electrode 136b disposed on the first upper electrode 136a. The auxiliary electrode 146a, the first upper electrode 136a, and the second upper electrode 136b may be formed via one mask operation, as will be described later.

The first upper electrode 136a and the auxiliary electrode 146a may be formed of the same material and have the same thickness. The second upper electrode 136b may be a single film or a multi-film formed of at least one material from among aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu).

The upper electrode 136 faces the lower electrode 134, and may form the capacitor C, together with the lower electrode 134. Although not illustrated, according to another embodiment, an upper electrode may face a gate electrode of a transistor to form a capacitor, together with the gate electrode. Here, the gate electrode may operate as the gate electrode of the capacitor as well as a lower electrode of the capacitor. In other words, the capacitor having high capacity may be realized by overlappingly forming a transistor and the capacitor, which occupy a large area in a pixel circuit unit, on a plane so as to obtain a sufficient channel length. Such a structure may enable the organic light-emitting display apparatus 1 to have high resolution, and an area of the second region 200 may be increased, thereby increasing transmittance.

An interlayer insulating film 117 covering the upper electrode 136 may be disposed on the upper gate insulating film 115, and the interlayer insulating film 117 may include a third opening 117a corresponding to the second region 200. The third opening 117a may overlap the second opening 120b along a direction perpendicular to the top surface 10a of the substrate 10. According to an embodiment, the auxiliary electrode 146a may be disposed in the third opening 117a formed in the interlayer insulating film 117. According to another embodiment, the third opening 117a may cover at least a part of the auxiliary electrode 146a.

The interlayer insulating film 117 may include a first contact hole CH1 corresponding to the drain region 122D, a second contact hole CH2 corresponding to the source region 122S, and a third contact hole CH3 corresponding to the upper electrode 136.

The transistor T may include a source electrode 128S and a drain electrode 128D respectively electrically connected to the source region 122S and the drain region 122D. The source electrode 128S may directly contact the source region 122S through the second contact hole CH2, and the drain electrode 128D may directly contact the drain region 122D through the first contact hole CH1.

The source electrode 128S and the drain electrode 128D may be disposed on the interlayer insulating film 117. The source region 122S of the transistor T may be electrically connected to the upper electrode 136 of the capacitor C through the source electrode 128S. Although not illustrated, the source electrode 128S and the upper electrode 136 of the capacitor C may be electrically connected to the power supply line PL of FIG. 2.

According to an embodiment, the data line DL disposed between the first and second pixels P1 and P2 may be disposed on the same layer and formed of the same material as the source electrode 128S and the drain electrode 128D.

The source electrode 128S, the drain electrode 128D, and the data line DL may be a single film or a multi-film formed of at least one material from among Al, Pt, Pd, Ag, Mg, Au, Ni, Nd, Ir, Cr, Li, Ca, Mo, Ti, W, and Cu.

A via insulating film 119 covering the transistor T and the capacitor C may be disposed on the interlayer insulating film 117, and the via insulating film 119 may be formed of an organic material. The via insulating film 119 may include a fourth opening 119a corresponding to at least the second region 200, and the fourth opening 119a may overlap the second opening 120b along a direction perpendicular to the top surface 10a of the substrate 10. According to an embodiment, the fourth opening 119a formed in the via insulating film 119 may expose at least a part of the auxiliary electrode 146a.

At least a part of the auxiliary electrode 146a may be exposed by the third opening 117a and the fourth opening 119a respectively included in the interlayer insulating film 117 and the via insulating film 119. According to an embodiment, an area of the third opening 117a is larger than an area of the fourth opening 119a, and the via insulating film 119 may directly contact a part of a top surface of the auxiliary electrode 146a exposed by the third opening 117a. In other words, the via insulating film 119 may cover an edge region of the auxiliary electrode 146a, and the remaining region of the auxiliary electrode 146a excluding the edge region covered by the via insulating film 119 may be exposed by the fourth opening 119a. By disposing the auxiliary electrode 146a between one region of the via insulating film 119 and the interlayer insulating film 117, a detaching phenomenon of the via insulating film 119, which is caused by weak adhesion between the via insulating film 119 formed of an organic material and the upper gate insulating film 115 formed of an inorganic material, may be prevented.

An organic light-emitting device OLED including the first electrode 150, the second electrode 170 facing the first electrode 150, and the intermediate layer 160 that includes the organic emission layer 162 disposed above the first electrode 150 and below the second electrode 170 may be disposed in the first region 100 above the via insulating film 119. The first electrode 150 may be electrically connected to the drain electrode 128D of the transistor T through a via hole VIA included in the via insulating film 119.

Two edges of the first electrode 150 may be covered by the pixel defining layer 120. The pixel defining layer 120 may include the first opening 120a exposing a part of the first electrode 150 and the second opening 120b corresponding to the second region 200. According to an embodiment, an area of the second opening 120b may be larger than an area of the fourth opening 119a included in the via insulating film 119.

The first electrode 150 may be a reflective electrode and the second electrode 170 may be a transparent or semi-transparent electrode. In other words, the organic light-emitting display apparatus 1 according to an embodiment may be a top-emission type.

The intermediate layer 160 including the organic emission layer 162 may be disposed above the first electrode 150 and below the second electrode 170, and a common layer 161 commonly disposed on all pixels may be disposed on the first electrode 150 and below the organic emission layer 162. Although not illustrated, another common layer may be disposed on the organic emission layer 162 and below the second electrode 170. The other common layer may include an electron transport layer (ETL) and/or an electron injection layer (EIL), and the common layer 161 may include a hole injection layer (HIL) and/or a hole transport layer (HTL).

According to an embodiment, the common layer 161 may include a fifth opening 161a corresponding to the second region 200. The fifth opening 161a may overlap the second opening 120b along a direction perpendicular to the top surface 10a of the substrate 10. At least a part of a top surface of the auxiliary electrode 146a is exposed by the fifth opening 161a, and the second electrode 170 may directly contact the top surface of the auxiliary electrode 146a, which is exposed by the fifth opening 161a.

The auxiliary electrode 146a may overlap the fifth opening 161a along a direction perpendicular to the top surface 10a of the substrate 10, and may directly contact the second electrode 170 that extends from the first region 100 to the inside of the fifth opening 161a included in the second region 200.

According to the one or more embodiments, even when the second electrode 170 is formed in a thin-film in order to realize the organic light-emitting display apparatus 1 in a top-emission type having high light efficiency, the organic light-emitting display apparatus 1 may have a reduced voltage drop as the auxiliary electrode 146a electrically connected to the second electrode 170 is disposed in the second region 200.

In other words, by reducing a voltage drop, quality of an image realized by the organic light-emitting display apparatus 1 may increase.

FIGS. 4A through 4M are cross-sectional views for describing a method of manufacturing the organic light-emitting display apparatus 1 of FIG. 2, according to an embodiment.

Figure 4A:
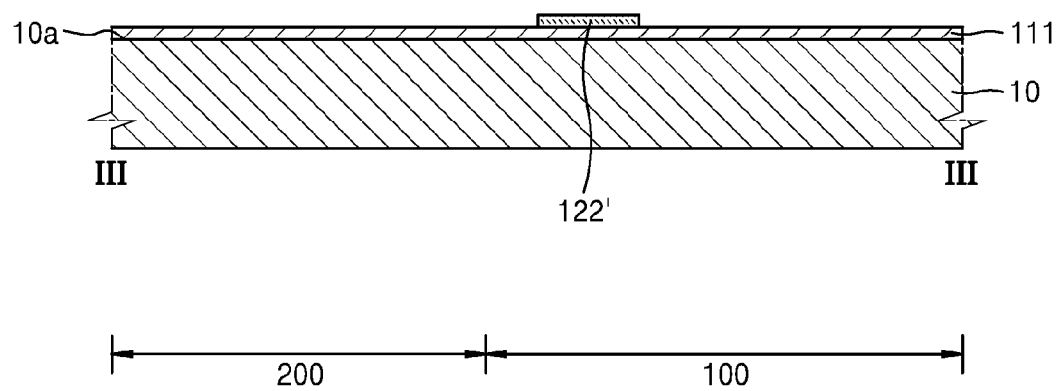
FIG. 4A is a cross-sectional view illustrating formation of buffer layer 111 and semiconductor pattern 122'.

Referring to FIG. 4A, after preparing the substrate 10 including the first region 100 realizing an image and the second region 200 through which an external light penetrates, a semiconductor pattern 122' is formed in the first region 100 of the substrate 10. Before forming the semiconductor pattern 122', the buffer layer 111 may be formed on the substrate 10.

The semiconductor pattern 122' may be formed by forming a semiconductor material over an entire surface of the substrate 10 and patterning the semiconductor material, and according to an embodiment, the semiconductor material may be polysilicon. The polysilicon may be formed by coating amorphous silicon over the substrate 10 and then crystallizing the amorphous silicon via a laser beam.

Figure 4B:
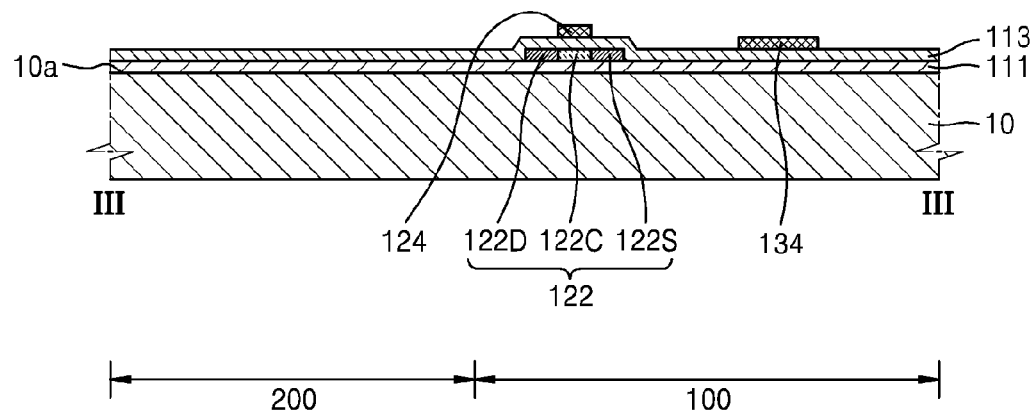
FIG. 4B is a cross-sectional view illustrating formation of active layer 122, gate electrode 124, and lower electrode 134 of capacitor C.

Referring to FIG. 4B, the lower gate insulating film 113 is formed above the substrate 10 to cover the semiconductor pattern 122' of FIG. 4A, and a first conductive material (not shown) is formed on the lower gate insulating film 113 and then patterned, thereby forming the gate electrode 124 of the transistor T and the lower electrode 134 of the capacitor C in the first region 100. The gate electrode 124 and the lower electrode 134 may be formed in the first region 100 on the lower gate insulating film 113, and the gate electrode 124 may face at least a part of the semiconductor pattern 122' of FIG. 4A.

After forming the gate electrode 124 and the lower electrode 134, an impurity is doped into parts of the semiconductor pattern 122' of FIG. 4A by using the gate electrode 124 as a mask, thereby forming the active layer 122 of the transistor T. The active layer 122 may include the source and drain regions 122S and 122D having conductivity as the impurity is doped, and the channel region 122C on which the impurity is not doped, and may be insulated from the gate electrode 124 by the lower gate insulating film 113.

Figure 4C:
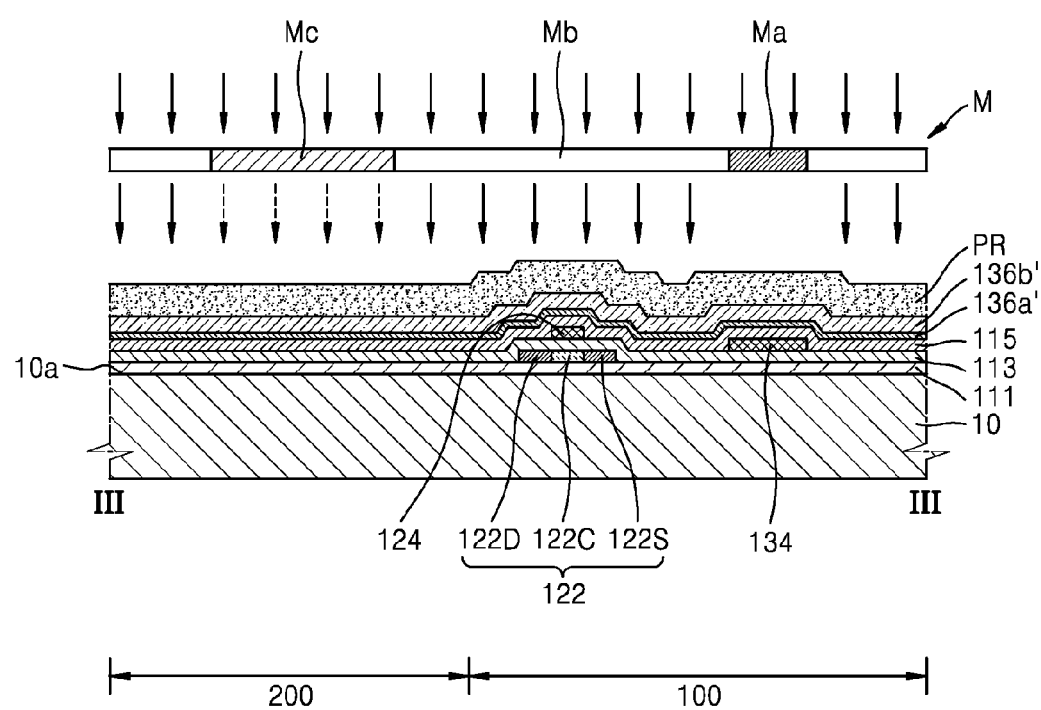
FIG. 4C is a cross-sectional view illustrating sequential formation of lower gate insulating film 113, upper gate insulating film 115, second conductive material 136a', third conductive material 136b', photoresist PR, and patterning using a halftone mask M.

Referring to FIG. 4C, after forming the upper gate insulating film 115 above the substrate 10 to cover the gate electrode 124 and the lower electrode 134, a second conductive material 136a', a third conductive material 136b', and a photoresist PR may be sequentially formed on the upper gate insulating film 115. The second conductive material 136a' may include a transparent conductive oxide.

After forming the photoresist PR, a light may be irradiated on the photoresist PR may using a halftone mask M including a shielding portion Ma blocking a light, a transmission portion Mb through which a light penetrates, and a semi-transmission portion Mc penetrating some of a light.

According to an embodiment, the second conductive material 136a' may be a transparent conductive oxide, and the third conductive material 136b' may be at least one material selected from among Al, Pt, Pd, Ag, Mg, Au, Ni, Nd, Jr, Cr, Li, Ca, Mo, Ti, W, and Cu. The photoresist PR may be a positive photoresist in which a region irradiated by a light is dissolved in a developing solution.

Figure 4D:
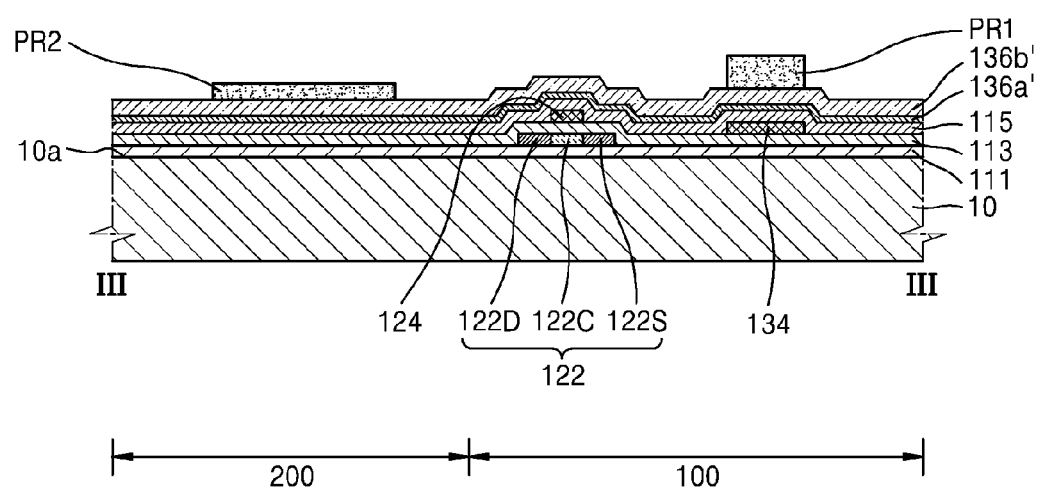
FIG. 4D is a cross-sectional view illustrating formation of first photoresist PR1 and second photoresist PR2.

Referring to FIG. 4D, after irradiating a light on the photoresist PR, a region of the photoresist PR irradiated by the light is removed, thereby forming a first photoresist PR1 corresponding to the lower electrode 134 and a second photoresist PR2 corresponding to at least a part of the second region 200 and having a thickness thinner than the first photoresist PR1.

Figure 4E:
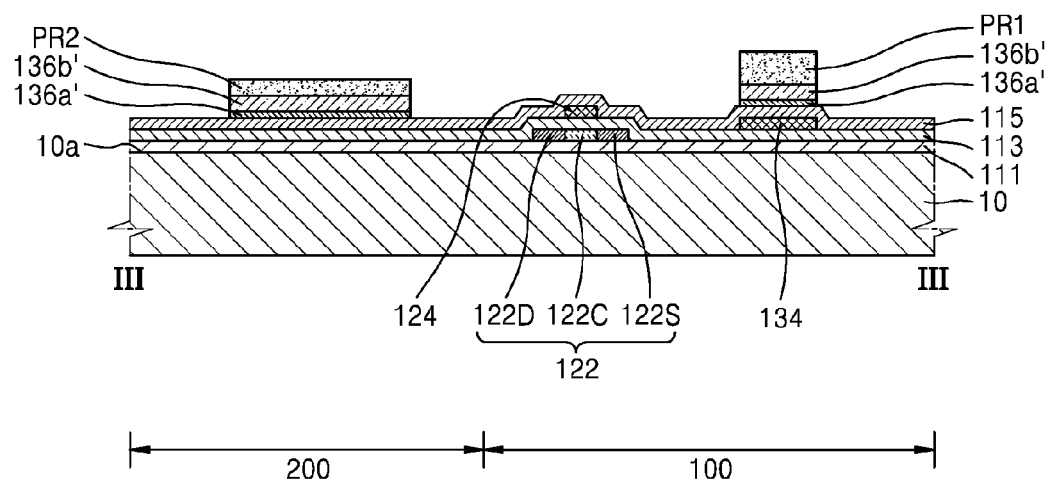
FIG. 4E is a cross-sectional view illustrating etching of second conductive material 136a' and third conductive material 136b' not covered by first photoresist PR1 and second photoresist PR2.

Referring to FIG. 4E, the third conductive material 136b' corresponding to a region from which the photoresist PR is completely removed, and the second conductive material 136a' disposed below the third conductive material 136b' corresponding to the region from which the photoresist PR is completely removed may be etched.

The third conductive material 136b' and the second conductive material 136a' may have different degrees of etch selectivity, and the second conductive material 136a' may not dissolve in a first etchant for etching the third conductive material 136b'. Accordingly, after etching the third conductive material 136b' by using the first etchant, the second conductive material 136a' may be etched by using a second etchant different from the first etchant.

Figure 4F:
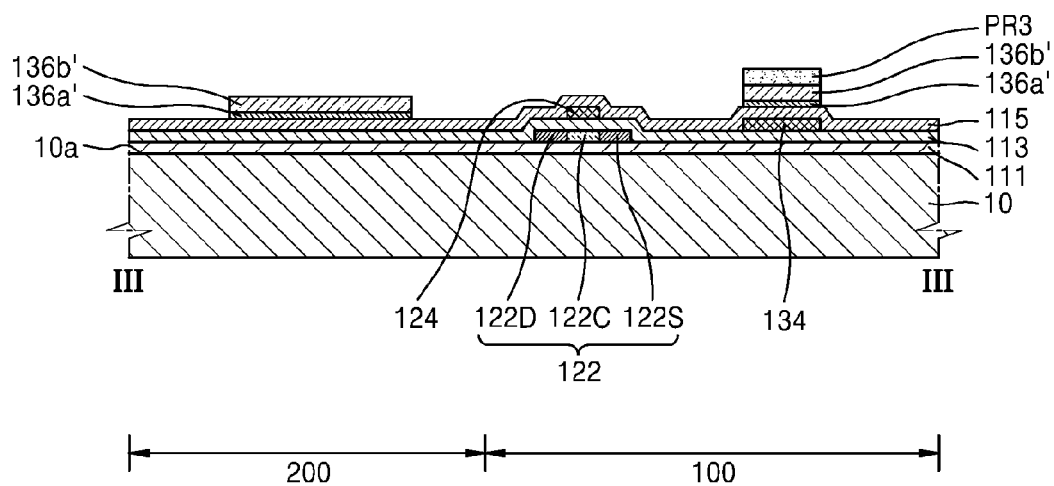
FIG. 4F is a cross-sectional view illustrating formation of third photoresist PR3 by ashing.

Referring to FIG. 4F, the second photoresist PR2 is completely removed and a part of the first photoresist PR1 is removed via ashing, thereby forming a third photoresist PR3. Since the third photoresist PR3 is formed as a part of the first photoresist PR1 is removed, the third photoresist PR3 may have a thickness thinner than the first photoresist PR1. When the second photoresist PR2 is removed, the third conductive material 136b' of the second region 200 may be exposed.

Figure 4G:
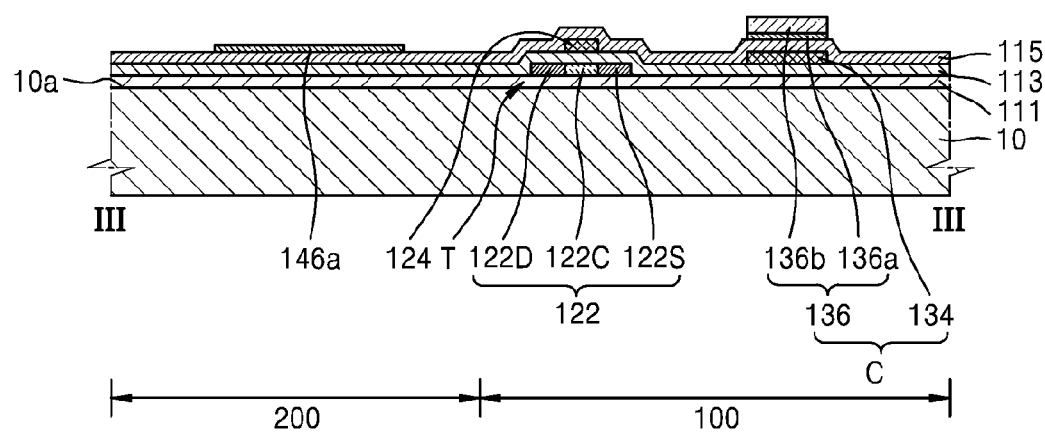
FIG. 4G is a cross-sectional view illustrating removal of third photoresist PR3 and formation of auxiliary electrode 146a and upper electrode 136 of the capacitor C.

Referring to FIG. 4G, the auxiliary electrode 146a may be formed by removing the third conductive material 136b' corresponding to a region from which the second photoresist PR2 is removed. Meanwhile, the third photoresist PR3 may be removed via ashing, and the upper electrode 136 of the capacitor C may be left in a region from which the third photoresist PR3 is removed. The upper electrode 136 may include the first upper electrode 136a and the second upper electrode 136b. In other words, the first and second upper electrodes 136a and 136b may be formed on the same layer as the auxiliary electrode 146a, and the first upper electrode 136a may be formed of the same material as the auxiliary electrode 146a.

According to processes shown in FIGS. 4B through 4G, the second conductive material 136a' and the third conductive material 136b' are patterned by using one mask, i.e. the halftone mask M, to form the auxiliary electrode 146a in the second region 200, and to form the upper electrode 136 of the capacitor C corresponding to the lower electrode 134 in the first region 100. However, an embodiment is not limited thereto, and the auxiliary electrode 146a and the upper electrode 136 may be formed via two mask operations. In other words, the auxiliary electrode 146a and the first upper electrode 136a may be formed by using one mask, and then the second upper electrode 136b may be formed on the first upper electrode 136a by using another mask.

The lower electrode 134 and the upper electrode 136 form the capacitor C, and the upper gate insulating film 115 may be a dielectric film disposed on the lower electrode 134 of the capacitor C and below the upper electrode 136 of the capacitor C.

Figure 4H:
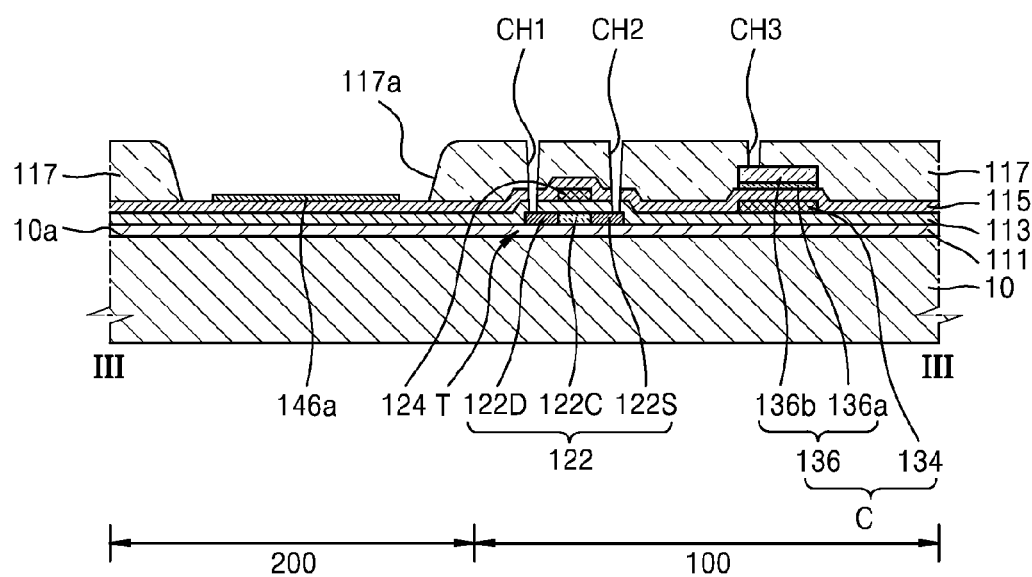
FIG. 4H is a cross-sectional view illustrating formation of interlayer insulating film 117.

Referring to FIG. 4H, a first insulating material (not shown) covering the auxiliary electrode 146a and the upper electrode 136 is formed on the upper gate insulating film 115 and then patterned to form the interlayer insulating film 117 including the third opening 117a corresponding to the second region 200. According to an embodiment, as shown in FIG. 4H, the third opening 117a may be formed to expose all of the auxiliary electrode 146a. Although not illustrated, according to another embodiment, the third opening 117a may cover at least a part of the auxiliary electrode 146a.

According to an embodiment, the interlayer insulating film 117 may include at least one of the first through third contact holes CH1 through CH3 corresponding to the first region 100. The first contact hole CH1 may expose at least a part of the drain region 122D, the second contact hole CH2 may expose at least a part of the source region 122S, and the third contact hole CH3 may expose at least a part of the second upper electrode 136b.

Figure 4I:
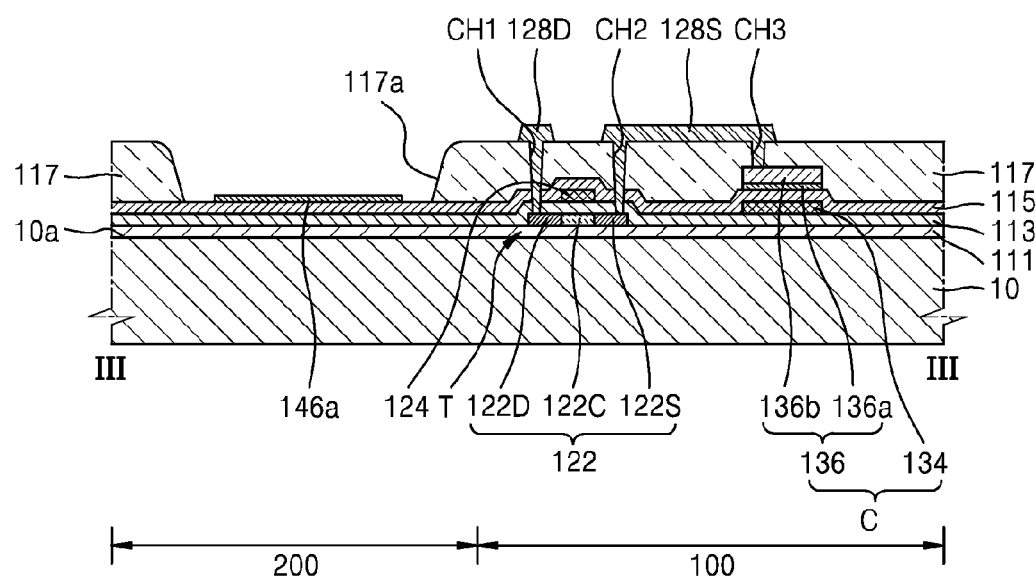
FIG. 4I is a cross-sectional view illustrating formation of drain electrode 128D and source electrode 128S of transistor T.

Referring to FIG. 4I, a fourth conductive material (not shown) covering the transistor T and the capacitor C is formed on the interlayer insulating film 117 and then patterned to form the drain and source electrodes 128D and 128S of the transistor T. According to an embodiment, the source region 122S and the second upper electrode 136b may be electrically connected to each other through the source electrode 128S.

Figure 4J:
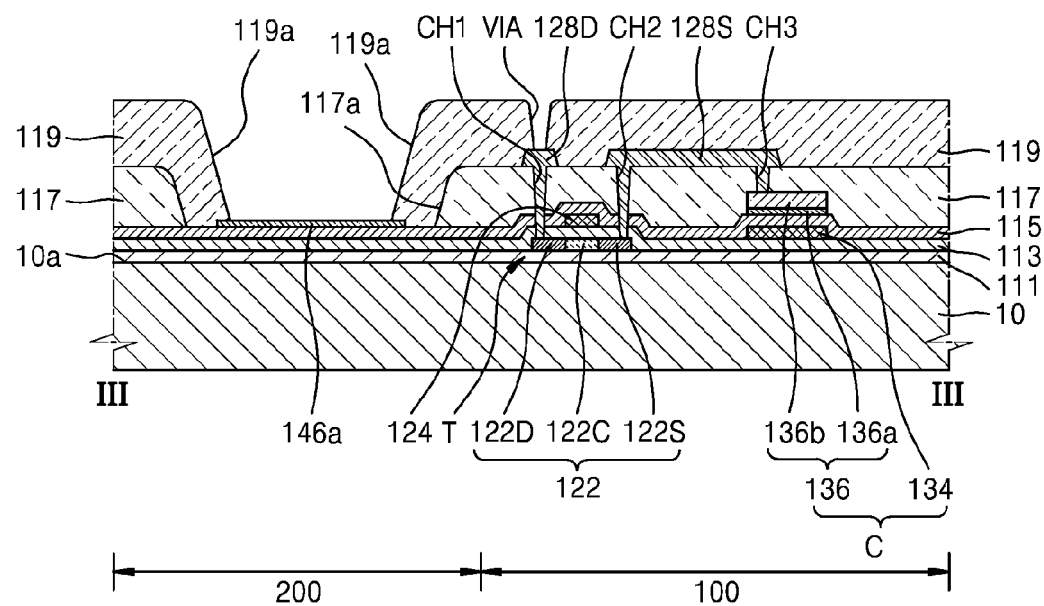
FIG. 4J is a cross-sectional view illustrating formation of via insulating film 119.

Referring to FIG. 4J, a second insulating material (not shown) covering the auxiliary electrode 146a, the drain electrode 128D, and the source electrode 128S is formed on the interlayer insulating film 117 and then patterned to form the via insulating film 119 including the fourth opening 119a corresponding to the second region 200. According to an embodiment, as shown in FIG. 4J, the fourth opening 119a may be formed to expose at least a part of the auxiliary electrode 146a.

According to an embodiment, the via insulating film 119 may include the via hole VIA exposing at least a part of the transistor T.

Through processes shown in FIGS. 4A through 4J, the pixel circuit unit electrically connected to the first electrode 150 and including the transistor T and the capacitor C may be formed in the first region 100 above the substrate 10.

Figure 4K:
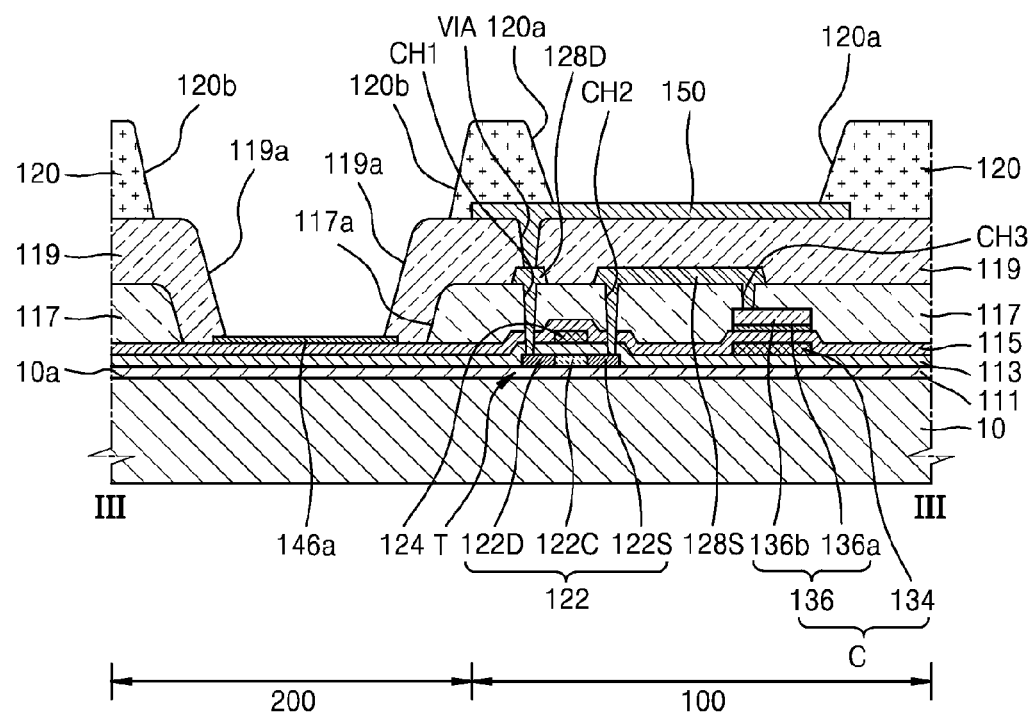
FIG. 4K is a cross-sectional view illustrating formation of first electrode 150 and pixel defining layer 120.
Figure 4L:
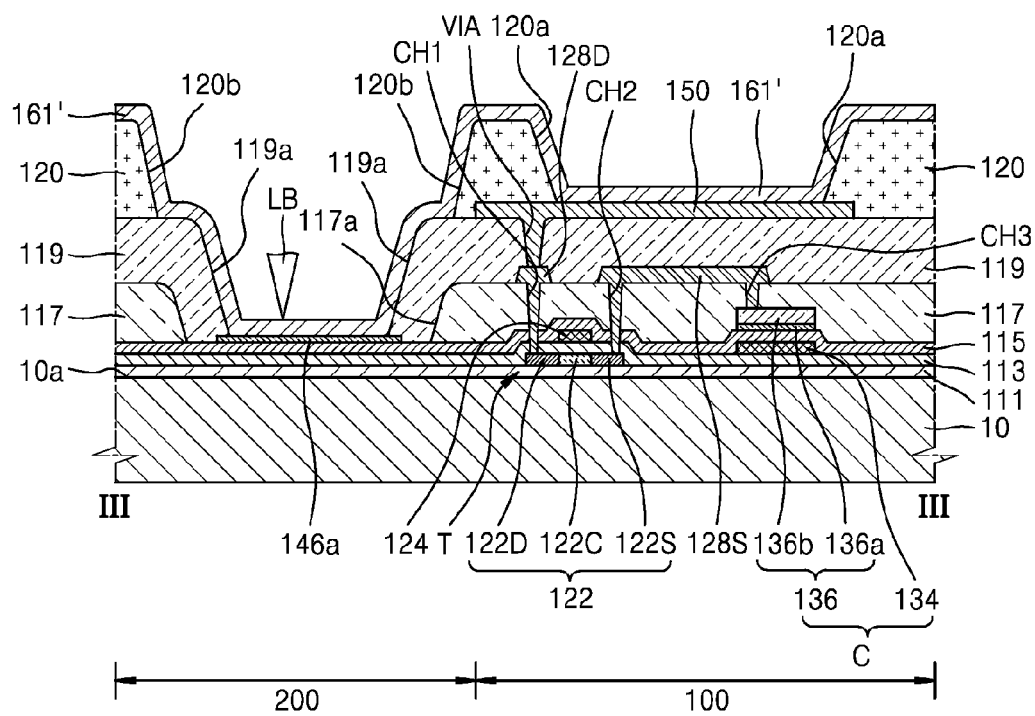
FIG. 4L is a cross-sectional view illustrating formation of common layer 161.

Referring to FIG. 4K, the first electrode 150 is formed in the first region 100 on the via insulating film 119, and a third insulating material (not shown) is formed on the first electrode 150 and then patterned, thereby forming the pixel defining layer 120 including the first opening 120a exposing at least a part of the first electrode 150 and the second opening 120b exposing at least a part of the auxiliary electrode 146a. According to an embodiment, the second opening 120b may be formed to expose all of the auxiliary electrode 146a. Although not illustrated, according to another embodiment, the second opening 120b may cover at least a part of the auxiliary electrode 146a.

Figure 4M:
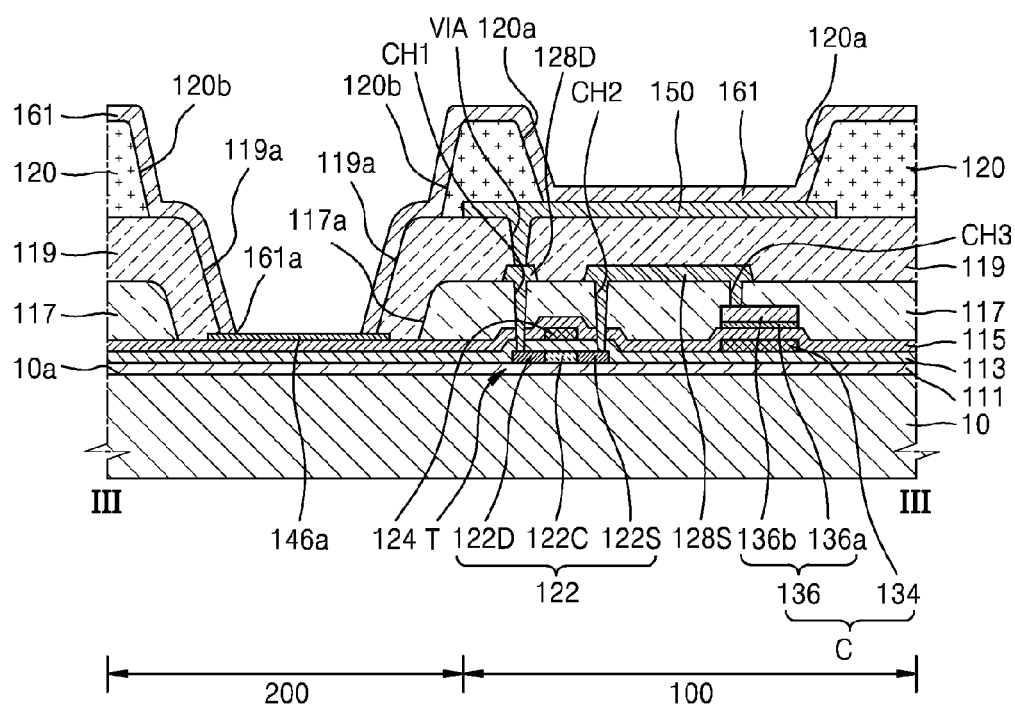
FIG. 4M is a cross-sectional view illustrating completion of the embodiment of FIG. 2.

Referring to FIGS. 4I and 4M, an organic material 161' covering the auxiliary electrode 146a, the first electrode 150, and the pixel defining layer 120 is formed on the via insulating film 119, and then the organic material 161' disposed on the auxiliary electrode 146a is removed, thereby forming the common layer 161 including the fifth opening 161a exposing at least a part of the auxiliary electrode 146a. The organic material 161' may be removed via laser drilling, in which a focused laser beam LB is irradiated on the organic material 161' such that the organic material 161' is removed via high energy of the focused laser beam LB.

Referring back to FIG. 3, after forming the organic emission layer 162 in the first region 100 on the common layer 161, the second electrode 170 is formed throughout the first and second regions 100 and 200. According to an embodiment, the second electrode 170 directly contacts the auxiliary electrode 146a exposed by the second opening 120b, and resistance of the second electrode 170 may be reduced by the auxiliary electrode 146a.

According to the method of manufacturing the organic light-emitting display apparatus 1, according to the one or more embodiments, a process of forming the auxiliary electrode 146a in the second region 200 is performed at the same time as a process of forming the upper electrode 136 of the capacitor C, and thus a separate mask is not required. In other words, the auxiliary electrode 146a may be easily formed in the second region 200 without having to use a separate mask.

According to one or more embodiments, an organic light-emitting display apparatus having increased display quality by reducing a voltage drop phenomenon while forming a second electrode in a thin-film, and a method of manufacturing the organic light-emitting display apparatus may be provided.

Also, an organic light-emitting display apparatus having improved display quality without an additional mask operation, and a method of manufacturing the organic light-emitting display apparatus may be provided.

Also, an organic light-emitting display apparatus having improved display quality while not reducing an aperture ratio by forming an auxiliary electrode electrically connected to a second electrode in a transmission region having a wide area in the organic light-emitting display apparatus, and a method of manufacturing the organic light-emitting display apparatus may be provided.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate comprising a first region configured to realize an image, and a second region through which an external light penetrates;
   a first electrode provided in the first region;
   an auxiliary electrode provided in the second region;
   a pixel defining layer provided in at least the first region and comprising a first opening exposing at least a part of the first electrode and a second opening exposing at least a part of the auxiliary electrode;
   a second electrode provided throughout the first region and the second region, facing the first electrode, and electrically connected to the auxiliary electrode; and
   an intermediate layer provided in at least the first region, provided above the first electrode and below the second electrode, and comprising an organic emission layer.

2. The organic light-emitting display apparatus of claim 1, wherein the auxiliary electrode overlaps the second opening along a first direction that is perpendicular to a top surface of the substrate.

3. The organic light-emitting display apparatus of claim 2, wherein the second electrode extends to inside of the second opening included in the second region and directly contacts the auxiliary electrode.

4. The organic light-emitting display apparatus of claim 1, wherein the auxiliary electrode is arranged in the second opening.

5. The organic light-emitting display apparatus of claim 1, wherein the auxiliary electrode comprises a transparent conductive oxide.

6. The organic light-emitting display apparatus of claim 1, further comprising a pixel circuit unit provided in the first region and electrically connected to the first electrode,
   wherein the pixel circuit unit comprises:
   a transistor comprising an active layer and a gate electrode insulated from the active layer; and
   a capacitor comprising a lower electrode provided on a same layer as the gate electrode, and an upper electrode facing the lower electrode.

7. The organic light-emitting display apparatus of claim 6, wherein the upper electrode is provided on a same layer as the auxiliary electrode and comprises a first upper electrode formed of a same material as the auxiliary electrode and a second upper electrode provided on the first upper electrode.

8. The organic light-emitting display apparatus of claim 6, wherein the active layer comprises a source region, a channel region, and a drain region, wherein the source region is electrically connected to the upper electrode.

9. The organic light-emitting display apparatus of claim 8, further comprising:
   a source electrode and a drain electrode, which are arranged above the gate electrode and respectively electrically connected to the source region and the drain region; and
   an interlayer insulating film provided above the gate electrode and below the source and drain electrodes, and comprising a third opening corresponding to the second region,
   wherein the third opening overlaps the second opening along a first direction that is perpendicular to a top surface of the substrate.

10. The organic light-emitting display apparatus of claim 6, wherein at least a part of the pixel circuit unit overlaps the first electrode along a first direction that is perpendicular to a top surface of the substrate.

11. The organic light-emitting display apparatus of claim 9, further comprising a via insulating film provided on the interlayer insulating film to cover the source and drain electrodes, and comprising a fourth opening corresponding to the second region,
    wherein the fourth opening overlaps the second opening along a first direction that is perpendicular to a top surface of the substrate.

12. The organic light-emitting display apparatus of claim 1, wherein the intermediate layer further comprises a common layer provided on the first electrode and below the organic emission layer,
    wherein the common layer comprises a fifth opening corresponding to the second region, and overlaps the second opening along a first direction that is perpendicular to a top surface of the substrate.

13. The organic light-emitting display apparatus of claim 12, wherein at least a part of a top surface of the auxiliary electrode is exposed by the fifth opening, and the second electrode directly contacts the top surface of the auxiliary electrode, which is exposed by the fifth opening.

14. A method of manufacturing an organic light-emitting display apparatus, the method comprising:
    preparing a substrate comprising a first region configured to realize an image and a second region through which an external light penetrates;
    forming an auxiliary electrode in the second region;
    forming a first electrode in the first region;
    forming, in at least the first region, a pixel defining layer comprising a first opening exposing at least a part of the first electrode and a second opening exposing at least a part of the auxiliary electrode;
    forming an organic emission layer in the first region; and
    forming, throughout the first region and the second region, a second electrode directly contacting the auxiliary electrode exposed by the second opening.

15. The method of claim 14, further comprising, before the forming of the first electrode, forming, in the first region, a pixel circuit unit electrically connected to the first electrode and comprising a transistor and a capacitor,
    wherein the forming of the pixel circuit unit comprises:
    forming an active layer of the transistor above the substrate;
    forming, above the active layer, a gate electrode insulated from the active layer and a lower electrode of the capacitor;
    forming an insulating film to cover the gate electrode and the lower electrode;
    forming, on the insulating film, a first conductive material and a second conductive material; and
    forming an auxiliary electrode in the second region and an upper electrode of the capacitor facing the lower electrode in the first region by respectively patterning the first conductive material and the second conductive material by using a mask.

16. The method of claim 15, wherein the first conductive material comprises a transparent conductive oxide.

17. The method of claim 15, wherein the forming of the auxiliary electrode and the upper electrode comprises:
    forming, on the insulating film, the first conductive material, the second conductive material, and a photoresist;
    irradiating, on the photoresist, a light by using a halftone mask comprising a transmission portion through which a light penetrates, a semi-transmission portion through which a light partially penetrates, and a shielding portion blocking a light;
    forming a first photoresist corresponding to the lower electrode and a second photoresist corresponding to at least a part of the second region and having a thickness thinner than the first photoresist by removing a region of the photoresist, on which the light is irradiated;
    etching the second conductive material corresponding to a region from which the photoresist is completely removed and the first conductive material formed below the second conductive material;
    forming a third photoresist by completely removing the second photoresist and removing a part of the first photoresist via ashing;
    forming the auxiliary electrode by removing the second conductive material corresponding to a region from which the second photoresist is removed; and
    removing the third photoresist.

18. The method of claim 15, further comprising:
    forming a first insulating material covering the auxiliary electrode and the upper electrode;
    forming an interlayer insulating film comprising a third opening exposing at least a part of the auxiliary electrode and a contact hole exposing at least a part of each of a source region and a drain region included in the active layer by patterning the first insulating material; and
    forming a source electrode and a drain electrode, which are respectively electrically connected to the source region and the drain region through the contact hole.

19. The method of claim 14, further comprising, before the forming of the organic emission layer:
    forming an organic material covering the auxiliary electrode and the first electrode; and
    forming a common layer comprising a fourth opening exposing at least a part of the auxiliary electrode by removing the organic material provided on at least a part of the auxiliary electrode.

20. The method of claim 19, wherein the organic material is removed via laser drilling.

* * * * *